US006721843B1

(12) United States Patent
Estakhri

(10) Patent No.: US 6,721,843 B1
(45) Date of Patent: Apr. 13, 2004

(54) FLASH MEMORY ARCHITECTURE IMPLEMENTING SIMULTANEOUSLY PROGRAMMABLE MULTIPLE FLASH MEMORY BANKS THAT ARE HOST COMPATIBLE

(75) Inventor: Petro Estakhri, Pleasanton, CA (US)

(73) Assignee: Lexar Media, Inc., Fremont, CA (US)

(*) Notice: Subject to any disclaimer, the term of this patent is extended or adjusted under 35 U.S.C. 154(b) by 360 days.

(21) Appl. No.: 09/611,676

(22) Filed: Jul. 7, 2000

(51) Int. Cl.[7] .......................... G06F 12/00; G06F 13/00

(52) U.S. Cl. .......................... 711/103; 711/5; 711/203; 365/230.03; 365/230.08

(58) Field of Search ............................ 711/5, 103–104, 711/202, 203, 206; 365/185.09, 185.11, 230.03, 230.08; 709/228

(56) References Cited

U.S. PATENT DOCUMENTS

| | | | | | |
|---|---|---|---|---|---|
| 4,525,839 | A | | 7/1985 | Nozawa et al. | 371/38 |
| 4,710,871 | A | | 12/1987 | Belknap et al. | 364/200 |
| 4,736,341 | A | | 4/1988 | Redmond et al. | 364/900 |
| 4,907,162 | A | * | 3/1990 | Fougere | 705/403 |
| 5,200,864 | A | | 4/1993 | Dunn et al. | 360/48 |
| 5,200,959 | A | | 4/1993 | Gross et al. | 371/21.6 |
| 5,255,136 | A | | 10/1993 | Machado et al. | 360/77.02 |
| 5,270,979 | A | | 12/1993 | Harari et al. | 365/218 |
| 5,283,882 | A | | 2/1994 | Smith et al. | 395/425 |
| 5,303,198 | A | | 4/1994 | Adachi et al. | 365/218 |
| 5,341,330 | A | | 8/1994 | Wells et al. | 365/185 |
| 5,341,339 | A | | 8/1994 | Wells | 365/218 |
| 5,357,475 | A | | 10/1994 | Hasbun et al. | 365/218 |
| 5,388,083 | A | | 2/1995 | Assar et al. | 365/218 |
| 5,430,859 | A | * | 7/1995 | Norman et al. | 711/103 |
| 5,455,721 | A | | 10/1995 | Nemazie et al. | 360/51 |
| 5,485,595 | A | | 1/1996 | Assar et al. | 395/430 |
| 5,500,848 | A | | 3/1996 | Best et al. | 369/275.3 |
| 5,523,903 | A | | 6/1996 | Hetzler et al. | 360/77.08 |
| 5,603,001 | A | | 2/1997 | Sukegawa et al. | 395/430 |
| 5,604,880 | A | * | 2/1997 | Dipert | 711/103 |
| 5,678,056 | A | * | 10/1997 | Nakamura | 709/228 |
| 5,737,742 | A | | 4/1998 | Achiwa et al. | 711/103 |
| 5,822,245 | A | * | 10/1998 | Gupta et al. | 365/185.12 |
| 5,835,935 | A | | 11/1998 | Estakhri et al. | 711/103 |
| 5,838,614 | A | | 11/1998 | Estakhri et al. | 365/185.11 |
| 5,905,993 | A | | 5/1999 | Shinohara | 711/103 |

(List continued on next page.)

FOREIGN PATENT DOCUMENTS

| | | | |
|---|---|---|---|
| WO | WO 98/29890 | 7/1998 | H01J/13/00 |
| WO | WO 99/44113 | 9/1999 | |

*Primary Examiner*—Reginald G. Bragdon
*Assistant Examiner*—Pierre M. Vital
(74) *Attorney, Agent, or Firm*—Haverstock & Owens LLP

(57) ABSTRACT

A Flash Memory Unit comprises a plurality of memory banks capable of simultaneously programming a plurality of pages into a plurality of data blocks within the respective memory banks. On start up, the Flash Memory System sends a signal to a Host. If the Host fails to respond, the Flash Memory Unit determines that the Host is a standard Host and stores data one page at a time. If the Host responds with a proper signal, the Flash Memory Unit determines that the Host is a high performance Host and stores multiple pages of data simultaneously. The high performance Host is configured to select identical LBA offsets from a plurality of Virtual Logical Blocks of User Data, and send the data defined by these Logical Block Addresses to the Flash Memory Unit for storage. The plurality of Logical Blocks of data are respectively transmitted to a plurality of RAM Data Registers, and simultaneously programmed into their respective memory banks. In sequential steps of programming, data defined by consecutive Logical Block Addresses are stored in Physical Pages defined by consecutive Physical Block Addresses. Data stored by a high performance Host is therefore retrievable by a standard Host.

39 Claims, 10 Drawing Sheets

HAND SHAKE DATA PACKET

U.S. PATENT DOCUMENTS 5,907,856 A 5/1999 Estakhri et al. ............ 711/103
5,920,731 A 7/1999 Pletl et al. ................ 395/834
5,946,714 A 8/1999 Miyauchi .................. 711/205
6,026,293 A 2/2000 Osborn ..................... 455/411
6,073,205 A * 6/2000 Thomson .................. 711/100
6,076,137 A 6/2000 Asnaashari ................ 711/103
6,081,878 A 6/2000 Estakhri et al. ............ 711/168
6,125,058 A 9/2000 Kuo et al. ............ 365/185.21
6,144,607 A 11/2000 Sassa ................... 365/230.03
6,173,314 B1 * 1/2001 Kurashima et al. ......... 709/204
6,360,220 B1 3/2002 Forin ........................... 707/8
6,462,986 B1 * 10/2002 Khan ..................... 365/185.2
6,484,216 B1 11/2002 Zegelin ...................... 710/11

* cited by examiner (Host Containing Correlation Data Coupled to a Flash Memory System)

FLASH MEMORY ARCHITECTURE IMPLEMENTING SIMULTANEOUSLY PROGRAMMABLE MULTIPLE FLASH MEMORY BANKS THAT ARE HOST COMPATIBLE

FIELD OF THE INVENTION

The present invention relates to the field of Flash Memory Systems. More particularly, the present invention relates to Flash Memory Systems interfacing with Host Systems.

BACKGROUND OF THE INVENTION

Flash memory technology is an electrically rewritable nonvolatile digital memory medium. Being non-volatile, it does not require a sustained voltage to retain digital data within its memory. A flash memory cell typically stores charge on a floating gate to represent a first logic state in the binary state system, while the lack of stored charge represents a second logic state in the binary state system. Flash memory cells typically support a write operation, a read operation, and an erase operation.

As flash memory technology has advanced, a variety of applications has become possible. In particular, flash memory implementations that emulate the mass storage function of conventional rotating magnetic media, e.g., a hard disk drive or a floppy disk drive, coupled to a host computer system or other host digital system have gained wide acceptance. Hard disk drives and floppy disk drives suffer several deficiencies which are not shared by flash memory technology. First, hard disk drives and floppy disk drives have many moving parts, e.g. an electrical motor, a spindle shaft, a read/write head, and a magnetizable rotating disk. These components give rise to reliability problems and magnify the hard disk drive's and floppy disk drive's susceptibility to failure resulting from the vibration and shock of being dropped or bumped. Secondly, a motor driven disk drive consumes a significant amount of power, substantially shortening the operational time between battery chargings. Finally, accessing data stored in the hard disk drive or the floppy disk is a relatively slow process.

In contrast, a Flash Memory System possesses many advantages over rotating storage disks. The typical Flash Memory System has no moving parts, accounting for the higher reliability of the typical Flash Memory System. In addition, the rugged design of the typical Flash Memory System withstands environmental conditions and physical mishandling that would otherwise be catastrophic to the hard disk drive or the floppy disk drive. Generally, a user can access data stored in the typical Flash Memory System fairly quickly. Finally, the power consumption of the typical Flash Memory System is considerably lower than the hard disk drive's and the floppy disk drive's power consumption.

Because of the market saturation and universal application of rotating media such as hard disk drives, even a superior process or device seeking to capture a share of the market must be compatible with existing software and operating systems. To achieve compatibility with systems configured to store data within legacy rotating mass storage systems, flash memory is typically broken up into a series of data fields capable of storing five hundred twelve bytes of user data and sixteen bytes of overhead data, thereby emulating the size of a data field typically available in commercial hard disks. FIG. 1 depicts a non-volatile memory array within a flash memory device. A collection of Physical Sectors or Pages 108, . . . 112 are typically capable of storing of five hundred twelve bytes of user data plus sixteen bytes of overhead data per Page, thereby conforming to the storage capacity of a sector of a typical rotating storage device. A plurality of Physical Pages 108, . . . , 112, typically sixteen or thirty two Pages, comprise a Physical Data Block 102.

According to the prior art, a Flash Memory System has been comprised of a single memory structure 100 comprising a plurality of Physical Data Blocks 102, . . . 106. Each data Physical Data Block 102, . . . , 106 is uniquely assigned a Virtual Physical Block Address (VPBA), for identifying and distinguishing a plurality of Physical Data Blocks comprising a Flash Memory System. Usually, each data block 102, . . . , 106 is selectively programmable and erasable.

FIG. 2 illustrates one embodiment of flash memory architecture according to the prior art. A Host 215, such as a computer or digital camera, transmits and receives data to a removable flash memory card 201. During transmission from the Host to the Flash Memory System, the Host assigns logical block addresses to the data. When retrieving the data, the Host requests data according to the logical block addresses which it previously assigned. The data enters a host interface circuit 203 of the flash memory Controller 202, by means of a host interface bus 220, typically comprising parallel bus architecture. The host interface circuit controls the storage of incoming data by means of a RAM Data Buffer 204. When a predetermined amount of data has been stored within the RAM Data Buffer 204, the memory interface circuit 205 transmits data through a memory bus 230 to the non-volatile Flash Memory Unit 206, which was disclosed in greater detail according to FIG. 1. Typically the data bus 230 is a parallel bus structure. The size of the data buffer 204 is advantageously designed to store an amount of data equal to a multiple of some non volatile memory field, such as a page comprising approximately five hundred twenty eight total bytes of data, depicted in FIG. 1.

At the present state of technology, a Flash Memory System has a limited number of program cycles before "wearing out." To ameliorate the problem of wearing-out, a controller discussed in greater detail in FIG. 2 attempts to cycle through the available memory locations before returning to the first location. By regulating the rate of wear among cells, the controller prevents uneven wear focusing on one area of the Flash Memory System. As a consequence of wear-leveling programs, all the cells within a Flash Memory System will therefore typically wear-out at the same rate. The wear-leveling program therefore reduces the likelihood that the Flash Memory System will experience premature degradation within a localized memory area due to overuse of one area. The entire Flash Memory System therefore remains uniformly reliable through its life. A hard disk drive does not require this wear leveling feature because its storage mechanisms can undergo a practically unlimited number of program/write operations without degrading performance. This contrast results in an operational disparity between the addressing system used within a flash memory, and that used within a hard drive or floppy disk.

In both hard drives and Flash Memory Systems, the physical addresses assigned within a memory typically follow a geometric structure within the memory system. That is, physical addresses will typically increment through successive memory locations. When User Data is received by a memory system, whether Flash Memory or rotating disk, a Host system normally assigns an address to incoming data. In a hard drive, data is typically stored in the sector whose physical address matches the logical address defined by the Host System. If a Host system updates User Data previously defined by a specific logical address, the new data will overwrite the original data at the prescribed address.

In a Flash Memory System, however, as a result of cycling through various areas of a flash memory according to a wear-leveling algorithm, physical areas defined by new physical addresses are continually filled. When a Host system updates User Data defined by a specific logical address and sends it to the Flash Memory System, the wear-leveling program will assign the incoming User Data to a physical location unrelated to the physical location in which User Data of the same logical address had previously been stored. Old data associated with a particular logical address is not immediately overwritten by incoming data of the same logical address. The old data is simply obsoleted, and the incoming data is written into the next available Physical Data Block, that is, the next addressable Physical Data Block that is free and non-defective. As a result, the Host assigns addresses to data that bear no relationship to the addresses where the flash memory ultimately stores the data. A distinctive characteristic of the wear-leveling data storage program implemented by the typical Flash Memory System therefore lies in the continuously changing relation between the logical addresses assigned by the Host, and the physical addresses actually used by the Flash Memory System. Through this dual memory process, a Flash Memory System is able to functionally emulate the relationship between a hard drive and a Host with respect to data storage and retrieval, thereby maintaining compatibility with existing software.

FIG. 3 illustrates various registers and fields used to take incoming data and store it within the Flash Memory Unit 206 (FIG. 2). In order to facilitate retrieval of User Data stored by a Host System, however, a correlation of logical and physical addresses must exist. This correlation is typically stored within the Flash Memory System, in the overhead portions of each page 108, . . . 112, and in the RAM Space Manager 370. When a Host transmits User Data 310, . . . , 316 identified by a set of logical addresses 302, . . . , 308 to a Flash Memory System, the Flash Memory System stores the data in certain physical locations 322, . . . 328 and then correlates the logical 302, . . . , 308 and physical 330, . . . , 336 addresses of that data in specifically designated correlation registers or fields such as the space manager 370. Subsequently, when the Host requests data identified by a specific logical address, the Flash Memory System examines the various registers, fields, or files correlating logical addresses to physical addresses. Upon locating the logical address requested by the Host, the Flash Memory System is able to secure the Physical Address correlating to that logical address. The Flash Memory System retrieves the User Data from that physical address.

The storage and retrieval process involves a series of operations of masking and concatenating various bits within various address registers. The bit register used to store a Logical Block Address can be divided into two sub-registers, a higher order bit field 342 and a lower order bit field 344 of LBA temporary register 340. A group of Logical Blocks 310, . . . , 316, typically sixteen or thirty two, defined by a common address within the higher-order bit field comprise a Virtual Logical Block 300. The number in the higher-order bit field is the Virtual Logical Block Address. The number in the lower order bit fields among the component Logical Blocks is an LBA offset which distinguish the individual Logical Blocks. The lower order addresses or offsets typically increment from zero through fifteen or zero through thirty-one, though any size Virtual Logical Block is possible. The higher order Virtual Logical Block address plus the lower order bits define a Logical Block address, as illustrated by LBA temporary register 340. Component Logical Blocks 310, . . . , 316 within a Virtual Logical Block are therefore defined by a Logical Block Address (LBA).

A Virtual Logical Block (VLB) 300 of data, defined by a Virtual Logical Block Address (VLBA) represents an amount of data equivalent to a physical area of memory known as a Physical Data Block 320 which is defined by a Virtual Physical Block Address (VPBA). A VPBA is comprised of complement Physical Pages. Consecutive pages within a VPBA are distinguished by PBA offset. The VPBA plus the PBA offset define a unique PBA or Physical Block Address 330, . . . , 336 for each page. Each Logical Block 310, . . . , 316 represents an amount of data equivalent to a physical Page 322, . . . , 328. Data fields and registers dedicated to correlating logical and physical addresses, such as a RAM Space Manager 370 consume valuable memory space within a Flash Memory System, memory that could otherwise be advantageously used to store User Data. If a Flash Memory System were comprised of sufficient correlation registers 380, . . . , 384 to correlate every LBA 345, 346, etc. to a respective PBA 330, . . . , 336 a great deal of Flash Memory would be consumed in the correlation function, leaving far less available memory for storing User Data. Such detailed correlation would be required, for example, if a Virtual Logical Block of User Data 300 were fragmented into sixteen or thirty-two component LBA's 302, . . . , 308 and stored in sixteen or thirty-two diverse pages distributed among different Physical Data Blocks within the Flash Memory System 200.

One way of minimizing that consumption of memory space devoted to correlation data is to limit correlation to larger groups of data, such as correlating Virtual Logical Blocks Addresses to Virtual Physical Block Addresses defining large blocks of physical memory. One way of retaining a correlation between component Logical Blocks of a VLB and individual Physical Pages of a Physical Data Block without multiplying correlation registers to include every Logical Block is to store consecutively addressed Logical Blocks 310, . . . , 316 of VLB 300 in consecutively addressed pages 322, . . . , 328 within a Physical Data Block 320. A one-to-one correlation between consecutive Physical Block Addresses 330, . . . , 336 within a Physical Data Block 320 and component Logical Block Addresses 302, . . . , 308 within a Virtual Logical Block 300 are thus retained through a spacial or quasi-spacial arrangement. No register need be devoted to correlating individual LBA's with individual Physical Page addresses. Only the VLBA in the high order bit field need be correlated to the VPBA representing the Physical Data Block.

FIG. 4 is a flow chart illustrating the storage of incoming User Data according to the data fields and registers of FIG. 3. In the first step 402, Virtual Logical Block seventeen 300 (FIG. 3) is received from a Host 215 for storage in a non-volatile Flash Memory Unit 206 (FIG. 2). In the following step 404, the Controller 202 moves the first LBA 302 to the temporary LBA Register 340. Next 406, the Controller masks the lower order bits 344 within the temporary LBA Register 340, and moves the VLBA 342 into a VLBA Register 360. In the next step 408, the Controller examines the Space Manager 370 and identifies VPBA correlation register 384 corresponding to the current VLB 349 as disclosed in the VLBA register 360. In the next step 412, the Controller 202 identifies a free and non-defective Physical Data Block 320 identified by a new VPBA. In the following step 414, the Controller 202 writes the new VPBA in the correlation register 384 of the Space Manager 370.

The Controller is now ready to identify specific pages 322, . . . , 328 within the select Physical Data Block 320 for storing incoming User Data within the incoming Virtual Logical Block 300. To achieve a one-to-one correlation between consecutive Logical Blocks 310, . . . , 316 within the Virtual Logical Block 300, and consecutive Physical Block Addresses 330, . . . , 336, the Controller combines the VPBA of the Physical Data Block 320 with the LBA offset of the current LBA 302, . . . , 308. In step 415 the Controller 202 stores the VPBA of the select Physical Data Block 320 in a temporary PBA register 351. In step 416, the Controller 202 masks the higher order bits 342 of the temporary LBA register 340 and concatenates the lower order bits 344 containing the LBA offset into the lower order register 354 of the temporary PBA register. The combined upper 352 and lower 354 registers from the temporary PBA register 351 form a Physical Block Address. In step 418, the processor then programs the Logical Block of data 310, . . . 316 identified by the temporary LBA Register 340 into the physical page 322, . . . , 326 identified in the temporary PBA Register 351.

In step 420, the controller examines the next Logical Block of incoming data, and moves the LBA of the incoming Logical Block into the temporary LBA register. According to the final step 422, if the value in the VLBA Register 360 remains unchanged, the Controller 202 returns to step 416. If the new User Data received from the Host 215 comprised a new VLBA, the process returns to step 402 and resumes.

Some of the steps in FIG. 4 could be performed in a different order without changing the outcome of the process. Because the specific mechanics of storage could be performed in a number of equivalent ways, the process disclosed in FIG. 4 is not intended to suggest that a correlated storage process according to the prior art necessarily follows these exact steps. The details are disclosed simply to illustrate one way of performing a data storage process in a manner that preserves a natural correlation between LBA's and PBA's. According to the process as described above, the LBA offset 344 is used as a PBA offset 354 when storing a VLB into a Physical Page. Because of the order preserved in the storage or programming process, individual LBA's requested by the Host 202 may be retrieved by the Flash Memory System 201.

FIG. 5 discloses a process according to the prior art whereby data is retrieved from the Flash Memory Unit 206 upon request from the Host 202. Again, the retrieval steps listed below are exemplary of data retrieval according to the prior art, and is not intended to limit the retrieval of data to any single algorithm according to the prior art. According to step 502, the Host 202 (FIG. 2) requests retrieval of data defined according to a particular LBA or group of LBA's 302, . . . , 308 (FIG. 3). In step 504, the Controller 202 moves the requested LBA 302, . . . , 308 to a temporary LBA register 340, conceptually depicted as comprising an upper 342 and lower 344 register of higher order bits and lower order bits respectively. In the next step 506, the Controller 202 masks out the lower order bits 344 and defines the requested VLBA in a temporary VLBA register 360 according to the value within the higher order register 342. In the following step 508, the Controller 202 increments the Space Manager 370 to the VLBA in the temporary VLBA register 360, thereby accessing the current correlation register 384 corresponding to the VLBA found in the temporary VLBA register 360. In step 510, the Controller 202 copies the VPBA found in the current correlation register 384 into the upper register 352 of the temporary PBA register 351. In the following step 512, the Controller 202 masks the higher order bits within the upper register 342 of the temporary LBA register 340 and concatenates the lower order bits within the lower register 344 containing the LBA offset into the lower order register 354 of the temporary PBA register 351. The combined upper 352 and lower 354 registers of the temporary PBA register 351 form a Physical Block Address. The Controller 202 is now able, according to step 514, to access the Physical Data Block defined by the Physical Block Address constructed within the temporary PBA register, and forward the User Data found therein to the Host. According to step 516, the controller also forwards the Logical Block Addresses in the temporary LBA Register to the Host, thereby defining the Logical Block of User Data according to the original address ascribed to it by the Host.

By concatenating the LBA offset onto a VPBA during the storage and retrieval process, the Controller is able to create an LBA to PBA correlation upon request, and need only store a correlation between the VLBA and the VPBA in the Flash Memory System 201, reducing the amount of memory necessary for correlation to only a fraction of what would be necessary without this process. Accordingly, when the Host requests the data defined by a series of Logical Block Addresses, the Flash memory retrieves the User Data from a physical location, and returns it to the Host. When the Host retrieves data therefore, the data sent to the Host is identified by the same address which the Host requested. The dual addressing scheme and cross referencing used within the Flash Memory System is invisible to the Host.

Although flash memory is typically much faster than rotating disk type memory, there is a wide disparity between the "read" and "write" times within flash memory. The read time of flash memory is on the order of microseconds, and compares favorably with RAM type memory. The programming or write operation to Flash Memory, however, is on the order of milliseconds, typically slower by powers of ten than the programming time typically found in RAM type memories. Accordingly, the RAM Data Buffer 204 is able to receive and retransmit digital data far faster than the non-volatile memory unit 206 is able to receive it. The programming phase of a Flash Memory System therefore becomes a major factor limiting the potential speeds possible through integrated circuit and MOS system incorporating Flash Memory components.

The speed of programming Flash Memory was substantially improved by the development of a multi bank Flash Memory System as seen in FIG. 6. A Flash Memory System 600 is operatively connected to a Host system 601 such as a computer or digital camera. A controller 604 comprising a Host Interface Circuit 605, a Data Buffer 607 and a Memory Interface Circuit 609 is operatively coupled to a Flash Memory Unit 602. The Flash Memory Unit 602 is comprised of a plurality of Memory Banks 621, . . . , 627. The first Bank 621 is comprised of a plurality of Physical Data Blocks 631, . . . , 637 and a single RAM Data Register 613. The second Bank 623 is comprised of a plurality of Physical Data Blocks 641, . . . , 647 and a single RAM Data Register 615. The third Bank 625 is comprised of a plurality of Physical Data Blocks 651, . . . , 657 and a single RAM Data Register 617. The fourth Bank 627 is comprised of a plurality of Physical Data Blocks 661, . . . , 667 and a single RAM Data Register 619. Typically, each of the plurality of Memory Banks 621, . . . , 627 are comprised of an equal number of Physical Data Blocks. Typically, each RAM Data Register 613, . . . , 619 has a data capacity equal to one Page of physical memory, which is typically capable of holding five hundred twelve bytes of User Data plus sixteen bytes of overhead data. The Flash Memory Unit 602 of FIG. 6 is comprised of four Memory Banks 621, . . . , 627 for exemplary purposes only. Multi-bank flash memories could be comprised of any number of memory-banks. Similarly, the size of data fields and memory areas are for exemplary purposes, depicting the more common configurations found according to the prior art. Neither these depictions of the prior art, nor its application to the present invention is intended to restrict the application of the present invention to any specific number of Memory Banks. Neither are the illustrations contained herein intended to restrict the sizes of data fields and registers, whether physical or logical, nor restrict an amount of incoming data being stored or processes. Rather, specific parameters such as sizes of data fields, the number of sub-groupings of physical memory comprising a larger memory component, or the number of sub-groupings comprising a larger group of data, are offered for illustrative purposes only, and have been selected to represent quantities frequently found in the prior art.

In multi-bank Flash Memory Systems 600, the RAM Data Buffer 607 does not directly store data into Flash Memory Blocks 631, . . . , 667. Rather, the RAM Data Buffer 607 loads data in to the plurality of RAM Data Registers 613, . . . 619, which then simultaneously load User Data into their respective Memory Banks 621, . . . 627. Each RAM Data Register 613, 615, 617, 619 is typically capable of storing and programming one page of data.

As the Flash Controller 604 receives information from the Host 601, the Host Interface Circuit 605 queues the information in the RAM Data Buffer 607. When the RAM Data Buffer 607 is filled according to a predetermined amount of data, the memory interface circuit 609 begins writing data from within the RAM Data Buffer 607 to select RAM Data Registers from among the plurality of RAM Data Registers 613, 615, 617, 619 within the Flash Memory Unit. In the four-bank Flash Memory Unit 602 depicted in FIG. 6, the Buffer 607 would typically store four pages of data. According to the most advantageous designed, the number of select RAM Data Registers typically equals the number of Virtual Logical Blocks of incoming data. Data Bus 611 is a parallel bus structure for moving data from the Data Buffer 607 to the Data Registers 613, 615, 617, 619. Because the RAM Data Buffer 607 and the RAM Data Registers 613, 614, 617, 619 are random access memory structures, the read and write times between these structures is extremely fast. After the select RAM Data Registers 613, . . . , 619 have filled, the individual RAM Data Registers 613, . . . , 619 simultaneously begin writing data to flash memory areas within their respective Memory Banks 621, . . . , 627. In a four bank system, programming time is reduced to approximately ¼ the time required in a traditional Flash Memory Unit. In a ten bank system, programming time with the reduced to approximately one tenth the programming time required by a traditional flash Memory Unit. A multibank system is therefore faster than a traditional Flash Memory Unit by a factor equal to the number of Ram Data Registers simultaneously engaged in programming User Data into a Flash Memory Unit.

Although the transmission and programming time from the RAM Data Buffer 607 to the RAM Data Registers 613, . . . , 619 is negligible when compared against the programming time for the Flash Memory cells, advanced designs can substantially reduce the time expended on writing User Data from the RAM Data Buffer 607 to RAM Data Registers 613, . . . , 619. FIG. 7 discloses a Memory Unit comprised of multiple Memory Banks 702, 704, 706, 708. A distinctive feature of this embodiment, however, is the presence of dual RAM Data Registers 710 & 720, 712 & 722, 714 & 724, 716 & 726, respectively assigned to each individual Memory Bank 702, . . . , 708. Each Memory Bank 702, . . . , 708 individually comprises a primary Register 710, 712, 714, 716 and an auxiliary Register 720, 722, 724, 726. According to this embodiment, the RAM Data Buffer 730 loads the four respective primary Registers 710, . . . , 716 with data to be stored in the Flash Memory cells of the respective Memory Banks 702, 704, 706, 708. Again, for continuity of the comparison, it is be assumed that there are a total of four Virtual Logical Blocks of incoming User Data, each VLB comprising thirty-two Logical Blocks of User Data, are to be distributed among the four Memory Banks 702, 704, 706, 708. Each Memory Bank 702, 704, 706, 708 will therefore receive one Virtual Logical Block, or thirty-two Logical Blocks data, programmed one page at a time, plus the overhead data associated with each page. This process will occur over thirty-two cycles.

By advantageously alternating between the primary Registers 710, . . . 716 and auxiliary Registers 720, 722, 724, 726, a time delay in writing data from the RAM Data Buffer 730 to the RAM Data Registers 710, . . . 726 would occur only on the first cycle of writing of the first four pages of data to the four respective registers. Programming of the Flash Memory of the respective Banks 702, . . . , 708 takes far longer than loading a page of memory into a RAM Data Registers. Therefore, as the primary Registers 710, . . . , 716 are programming their respective pages of data into the Flash Memory Cells of their respective Memory Banks 702, . . . , 708, the RAM Data Buffer 730 can load a next four pages of data into the four auxiliary Registers 720, . . . , 726. Because this takes place while the Flash Memory cells are being programmed by their respective primary Registers 710, . . . 716, there is no actual delay imposed in the writing of the auxiliary Registers 720, . . . , 726. When the primary Registers 710, . . . , 716 have finished loading their respective pages of data into the Memory cells of their respective Memory Banks 702, . . . , 708, the auxiliary Registers 720, . . . 726 are immediately ready to begin loading their respective pages of data into their respective Memory Banks 702, . . . 708. During the programming of the auxiliary registers 720, 722, 724, 726 into their respective Physical Data Blocks, the RAM Data Buffer 730 can simultaneously load the next cycle of data into the primary registers. This process of simultaneously loading data into one set of registers while a complimentary set of registers programs select Flash Memory cells continues until the select data has been loaded into the Flash Memory. As noted, the only delay imposed by the loading of data from the RAM Data Buffer 730 into the respective RAM Data Registers 710, . . . , 716 occurs during the first cycle.

Assuming that each RAM Data Register has a capacity of one page of data, which is roughly equal to one Logical Block of User Data; where N=the total number of Memory Banks being utilized in a programming operation according to the present invention, p=the total number of pages to be loaded, t=the amount of time to load a single page of data into a single RAM Data Register or RAM Data Buffer, and T=the amount of time required to program a single page of data into Flash Memory, the following table compares the programming speeds according to the prior art FIG. 2, multiple Memory Banks with a single RAM Data Register per Memory Bank according to the present invention (FIG.

6), and multiple Memory Banks with dual RAM Data Registers according to the present invention (FIG. 7):

| Total Programming Time ($P_{rog}T_{ime}$) | |
|---|---|
| A. Traditional Flash Memory System of FIG 2 | $P_{rog}T_{ime} = p(t = T)$ |
| B. Multi-bank Flash Memory System of FIG 6 | $P_{rog}T_{ime} = p(t + T/N)$ |
| C. Dual RAM Flash Memory System of FIG 7 | $P_{rog}T_{ime} = Nt + p(T/N)$ |

The programming times for the above table assumes that the Data Bus 611, 740 of the multi bank systems carries data at the same rate as the Data Bus 230 of a traditional Flash Memory Unit. If Data Bus 611, 740 according to the current invention could program all RAM Data Registers 710, . . . , 716 simultaneously through a parallel configuration, the above equations would have to be altered slightly.

Returning to the discussion according to FIG. 6, according to the above illustration, N Memory Banks per Memory Unit effectively results in a total programming time that is N times as fast as an application with a traditional Flash Memory Unit. On first blush, this would appear to invite the construction of Memory Units comprising hundreds of Memory Banks. Although there is no theoretical limit to the number of Memory Banks that might be incorporated within a multi-bank Flash Memory Unit, operational parameters according to a particular application will typically dictate practical limits to the number of Memory Banks that can be effectively utilized.

According to the prior art, multi-bank Flash Memory units were programmed according to an interleaving process, illustrated in conjunction with FIG. 8. According to the following illustration, it is assumed for exemplary purposes only that each VLB comprises thirty-two individual Logical Blocks in four Physical Data Blocks. It is also assumed for exemplary purposes that each Register 840, . . . 846 programs one Page of User Data per cycle, one Page corresponding to one Logical Block of User Data. Four consecutive VLB's of User Data contain one-hundred twenty eight Logical Blocks 810, . . . , 826 of data, which may be represented either by an address, or an offset number measured against the total number of Logical Blocks in the incoming set of User Data 802. For example, the third Logical Block 825 within the fourth Virtual Logical Block 806 can be represented either by the address 24:2, indicating VLBA 24, offset 2, or simply according to the total offset number 98, measured against all one hundred twenty-eight Logical Blocks in the incoming set of User Data 800. Four consecutive VLB's 803, 804, 805, 806 comprising a single set of incoming User Data 800 are processed by the Controller 604 (FIG. 6), and essentially form one continuous stack of incoming data.

When data was stored in such a multibank structure according to the prior art, an interleaving process fragments a single Virtual Logical Blocks of data into multiple Physical Memory Blocks. This process can be illustrated in in conjunction with FIG. 8. Consecutive logical blocks 810, 811, 812, 813 within the same Virtual Logical Block 803 are consecutively loaded into the RAM Data Registers 840, . . . , 846 for storage. In the first cycle, Logical Block 21:0 810 is loaded into RAM Data Register 1 840, Logical Block 21:1 811 is loaded into RAM Data Register 2 842, Logical Block 21:2 812 is loaded into RAM Data Register 3 844, and Logical Block 21:3 813 is loaded into RAM Data Register 4 846. The contents of the four registers 840, . . . , 846 are then simultaneously programmed into the first Pages 858, 861, 864 and 870 within four separate and distinct Physical Data Blocks 850, 852, 854, 856 within the respective Memory Banks 832, 834, 836, 838. Data stored according to this interleaved process therefore fragments a single Virtual Logical Block of Data Across four separate Physical Memory Blocks 850, 852, 854, 856 disposed within four separate Memory Banks 832, 834, 836, 838. When the data were retrieved in a reverse process, it can be reconstructed accurately. However, if a reverse interleaving process is not utilized, reconstruction of the User Data becomes problematic. Although reconstruction can be accomplished through detailed Correlation Fields which correlate LBA's to PBA's, the resulting liabilities in memory consumption make this option largely unworkable.

Because the interleaving process is achieved in part to the activity of the Host, a Host designed to work in conjunction with a standard or single-bank Flash Memory Unit can only reconstruct a file of User Data when a single VLB is stored in a single VPB, establishing a one-to-one Correlation between the LBA's and the PBAs. Older Hosts therefore cannot retrieve data from multiple memory banks that store data in a fragmented or interleaved fashion; the systems are simply not compatible. The problem could theoretically be resolved by designing a multibank flash memory stick with a RAM Data buffer 830, FIG. 8 of sufficient data capacity to store the four incoming Virtual Logical Blocks of data 803, . . . , 806, and perform the interleaving process transparently within the flash memory stick. A Host would simply load data continuously into a RAM Data Buffer of the Flash Memory System. How the Flash Memory System processed the data would be transparent, and therefore irrelevant and to the Host. The obvious drawback is the massive amount of memory which must be set aside for use by the RAM Data buffer. Similarly, the problem could be solved by devoting a massive amount of memory within the Flash Memory System to the RAM the Space Manager. If every single LBA were correlated to every single PBA, fragmentation would not prevent reconstruction of data. Again however, a massive amount of valuable memory would have to be devoted to the random access memory of the Flash Memory System, reducing the actual capacity of the flash memory itself. Although either of these solutions might resolve the problem of designing a Flash Memory System compatible with various Hosts, they do not lend themselves well to Flash Memory applications.

There exists therefore need for a multi-bank flash memory stick which exhibits the speed advantages a multibank Flash Memory Unit, while maintaining downward compatibility with older Hosts designed for traditional single bank Memory sticks. There further exists a need for a Host that can utilize the speed advantages of a multibank flash Memory Unit while storing the data in an arrangement that can later been retrieved by older Hosts. There further exists a need for a user friendly means for configuring a Flash Memory System to store data in a proper arrangement according to the capabilities and format of the Host transmitting the data for storage. There further exists a need for a user friendly means of configuring a Host to send and retrieve data in a format or protocol that is compatible with both traditional single-bank flash memory sticks, and multibank Flash Memory sticks. There further exists a need for achieving compatibility while minimizing the amount of memory expended on the RAM Data buffer. There further exists a need for achieving compatibility with diverse Hosts while minimizing the amount of flash memory expended on the RAM a Space Manager.

BRIEF DESCRIPTION OF THE INVENTION

The present invention discloses a method and apparatus for storing incoming user data in a multibank Flash Memory System which exhibits the speed advantages a multibank Unit while storing a Virtual Logical Block of data in a non fragmented arrangement, thereby maintaining downward compatibility with older Hosts designed for traditional single Memory Banks sticks. The present invention further discloses a method and apparatus for utilizing the speed advantages of a multibank Flash Memory Unit while storing data in an arrangement accessible to older Hosts. The present invention further discloses a method and apparatus for configuring a multibank Flash Memory System to store data in a proper arrangement according to the capabilities and format of a Host transmitting the data for storage. The present invention further discloses a method and apparatus for configuring a high-performance Host to send and retrieve data in a format or protocol that is compatible with both traditional single-bank flash memory sticks, and multibank Flash Memory sticks. The present invention further discloses a method and apparatus for achieving compatibility with both traditional and high performance Hosts while minimizing the amount of memory expended on the RAM Data buffer. The present invention further discloses a method and apparatus for achieving compatibility with both traditional and high performance Hosts while minimizing the amount of memory expended on the RAM Space Manager.

According to one embodiment of the present invention, a Flash Memory System comprises a plurality of separate and independently addressable Memory Banks. Each Memory Bank comprises a plurality of independently addressable and independently programmable non-volatile Data Storage Areas and a primary RAM Data Register. A first primary RAM Data Register within a first Memory Bank is capable of programming data into Data Storage Areas within the first Memory Bank, and a second primary RAM Data Register within a second Memory Bank is capable of programming data into Data Storage Areas within the second Memory Bank. The Flash Memory System also comprises a Vendor Unique Value, including means for loading the Vendor Unique Value into a Handshake Data Envelope upon start up. When no responsive handshake is received from a Host, the Flash Memory System defaults to a first mode for storing data in a manner compatible with traditional Hosts. When the responsive handshake is received from the Host, the Flash Memory System is configured to a second data storage mode capable all of storing multiple pages of data simultaneously by means of the multiple Memory Banks.

According to one embodiment of the present invention, a Flash Memory System comprises a plurality of separate and independently addressable Memory Banks. Each Memory Bank comprises a plurality of independently addressable and independently programmable non-volatile Data Storage Areas, and a primary and an auxiliary RAM Data Register. A first primary and first auxiliary RAM Data Register within a first Memory Bank are independently capable of programming data into Data Storage Areas within the first Memory Bank. A second primary and the second auxiliary RAM Data Register within a second Memory Bank are independently capable of programming data into Data Storage Areas within the second Memory Bank. When operating in a high-performance storage mode utilizing simultaneous programming of multiple Memory Banks, sequential programming cycles will alternately utilize the primary and auxiliary RAM Data Registers for data storage. The Flash Memory System also comprises a Vendor Unique Value, including means for loading the Vendor Unique Value into a Handshake Data Envelope upon start up. If no responsive handshake is received from a Host, the Flash Memory System defaults to a first mode for storing data in a manner compatible with traditional Hosts. If a responsive handshake is received from the Host, the Flash Memory System is configured to a second mode, capable all of storing multiple pages of data simultaneously by means of the multiple Memory Banks.

According to one embodiment of the present invention, a method of programming incoming data into a multibank Flash Memory System comprising a Vendor Unique Value, a Controller operatively connected to a Memory Unit, the Controller comprising a RAM Data Buffer operatively connected to a Memory Interface Circuit, the Flash Memory Unit comprising a plurality of separate and individually addressable Memory Banks, each Memory Bank comprising a primary RAM Data Register and a plurality of individually addressable and individually programmable Physical Data Blocks, each Physical Data Block comprising a plurality of individually addressable and individually programmable Pages, the method comprising the steps of generating a Handshake Data Envelope, loading the Vendor Unique Value within a Flash Memory System into the Handshake Data Envelope; and sending the Handshake Data Envelope to a Host. If no responsive handshake is received from the Host, the Flash Memory System defaults to a first data storage configuration and programs incoming data into the Flash Memory System according to a first data storage method of programming one page of User Data per programming cycle. If a responsive handshake is received, the Flash Memory System is configured to a second data storage configuration which includes the simultaneous programming of a plurality of pages of data into multiple Memory Banks on each programming cycle. The programming is performed in a non-interleaved fashion so that consecutive Logical Block Addresses within a common Virtual Logical Block Address are stored in consecutive physical block addresses in a common Physical Data Block.

According to one embodiment of the present invention, a method of programming incoming data into a multibank Flash Memory System comprising a Vendor Unique Value, a Controller operatively connected to a Memory Unit, the Controller comprising a RAM Data Buffer operatively connected to a Memory Interface Circuit, the Flash Memory Unit comprising a plurality of separate and individually addressable Memory Banks, each Memory Bank comprising a primary RAM Data Register, an auxiliary RAM Data Register and a plurality of individually addressable and individually programmable Physical Data Blocks, each Physical Data Block comprising a plurality of individually addressable and individually programmable Pages, the method comprising the steps of generating a Handshake Data Envelope, loading the Vendor Unique Value within a Flash Memory System into the Handshake Data Envelope, and sending the Handshake Data Envelope to a Host. If no responsive handshake is received from the Host, the Flash Memory System defaults to a first data storage configuration and programs incoming data into the Flash Memory System according to a first data storage method of programming one page of User Data per programming cycle. If a responsive handshake is received, the Flash Memory System is configured to a second data storage configuration which includes the simultaneous programming of a plurality of pages of data into multiple Memory Banks on each programming cycle. The programming is performed in a non-interleaved fashion so that consecutive Logical Block Addresses within a common Virtual Logical Block Address are stored in consecutive physical block addresses in a common Physical Data Block. Sequential programming cycles will alternately utilize the primary and auxiliary RAM Data Registers for data storage.

These and other advantages will become apparent to those of ordinary skill in the art after having read the following detailed description of the preferred embodiments which are illustrated in the various drawings and figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENT

Figures 1, 2:
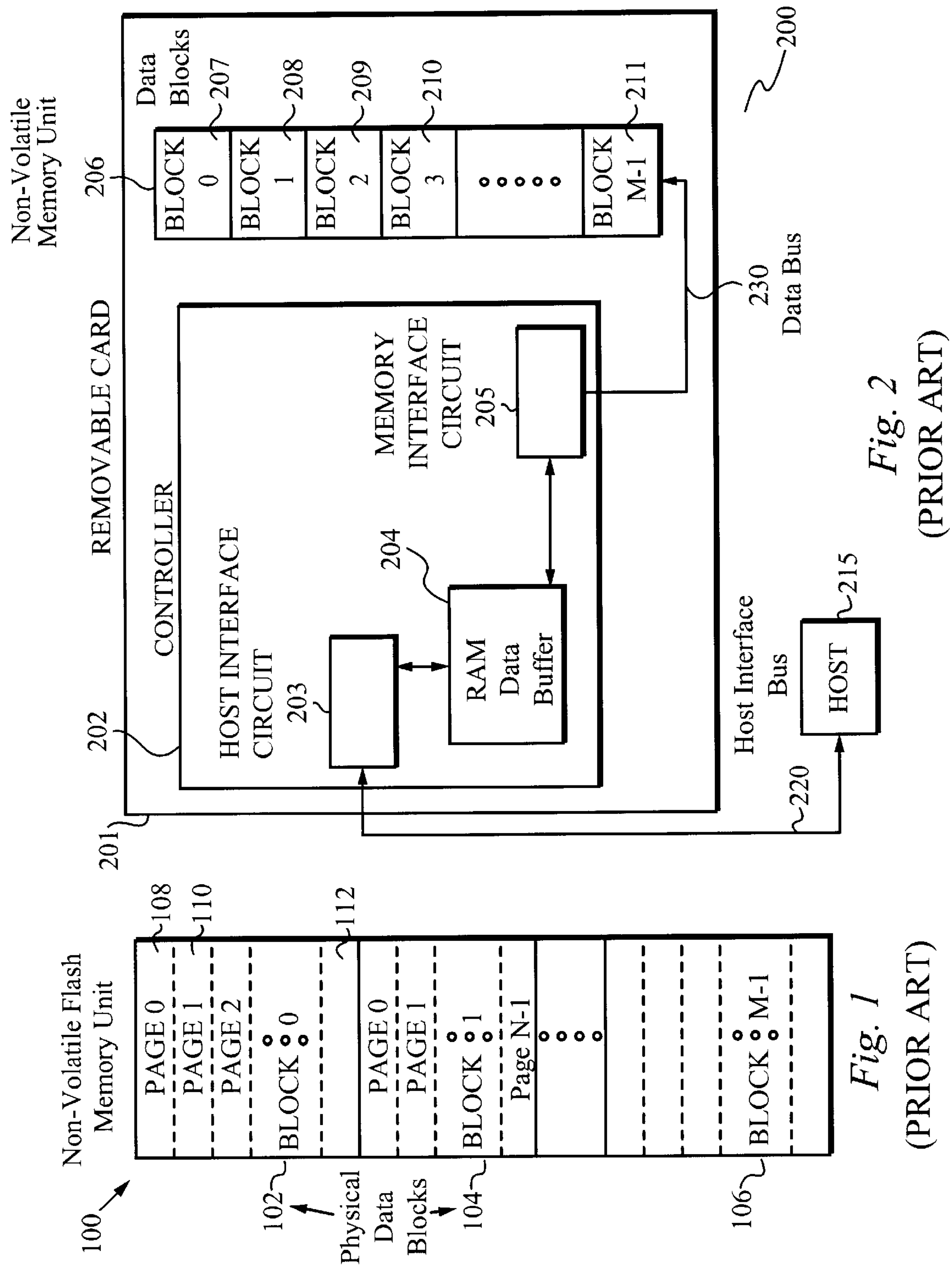
FIG. 1 is an illustration a group of Physical Memory Blocks comprising a plurality of pages.
FIG. 2 is a removable flash memory card coupled to a Host according to the prior art.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. For example, within the following disclosure, a collection of data may commonly be referred to as a Virtual Logical Block of data comprising component Logical Blocks of data. A discussion incorporating these terms is not intended to limit the invention to specific units of data commonly used within the art today, but simply to illustrate the function of groupings and sub-groupings of data by terms familiar to those skilled in the art. This same principle is true for specific groupings of Physical memory, such as Physical Data Blocks and component Pages within Physical Data Blocks, which are presented as representative examples of how larger addressable memory areas may be comprised of smaller component memory areas. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the arts. A procedure, logic block, process, etc., is here, and generally, conceived to be a self-consistent sequence of steps or instructions leading to a desired result. These steps are those requiring physical manipulations of physical quantities. When dealing with computer type devices, components, structures or activities, it has proven convenient at times, principally for reasons of common usage, to refer to these signals as bits, bit streams, data streams, envelopes, packets, registers, fields, bytes, values, elements, symbols, characters, term, numbers, or the like.

It should be further borne in mind that, in discussions of electrical components, the terms "connected," "operatively connected," "electrically connected," and like terms denote an electrical path between two components. It is understood, however, that such terms do not preclude the existence of additional components interposed between the two original components, even if an additional such component has the capability of interrupting or affecting signal or data transmission between the two original components. Only through use of the term "directly connected," or like terms, is it intended to denote an electrical connection between two components that precludes any additional components, other than an electrical conductor, interposed between the two original components. Finally, data being transmitted comprises at least three different elements, the data, the envelope containing the data, often called a Logical Block or a virtual logical block, and an address. An address such as an LBA may be thought of as identifying a collection of data, or the envelope (Logical Block) in which the data is stored. An actual address may exist as bits within a data packet, or may be generated by a receiving processor as it counts consecutively received data packets. In such a case, an address does not even exist as a real entity. A Logical Block itself may be thought of as a collection of data, or as an envelope containing a collection of data. Consecutive Logical Block Addresses may be thought of as belonging to a common envelope of data (the virtual logical block), or to a common address, (the virtual logical block address). The term "consecutive" may itself be variously described to consecutive addresses (for example, consecutive LBA's), consecutive data envelopes (for example consecutive LB's) or consecutive collections of data within consecutive envelopes defined by consecutive addresses. Because of the ephemeral nature of data, particularly data under transmission, as illustrated by these examples, there is oftentimes no one "right" way of describing relationships between data, data envelopes, and data/envelope addresses. Although care has been taken to use terms which best clarify a process or structure described herein, descriptions of relationships, manipulation, and storage of data, data envelopes, and their respective addresses must always be evaluated in light of the context in which the statements occur.

Figure 8:
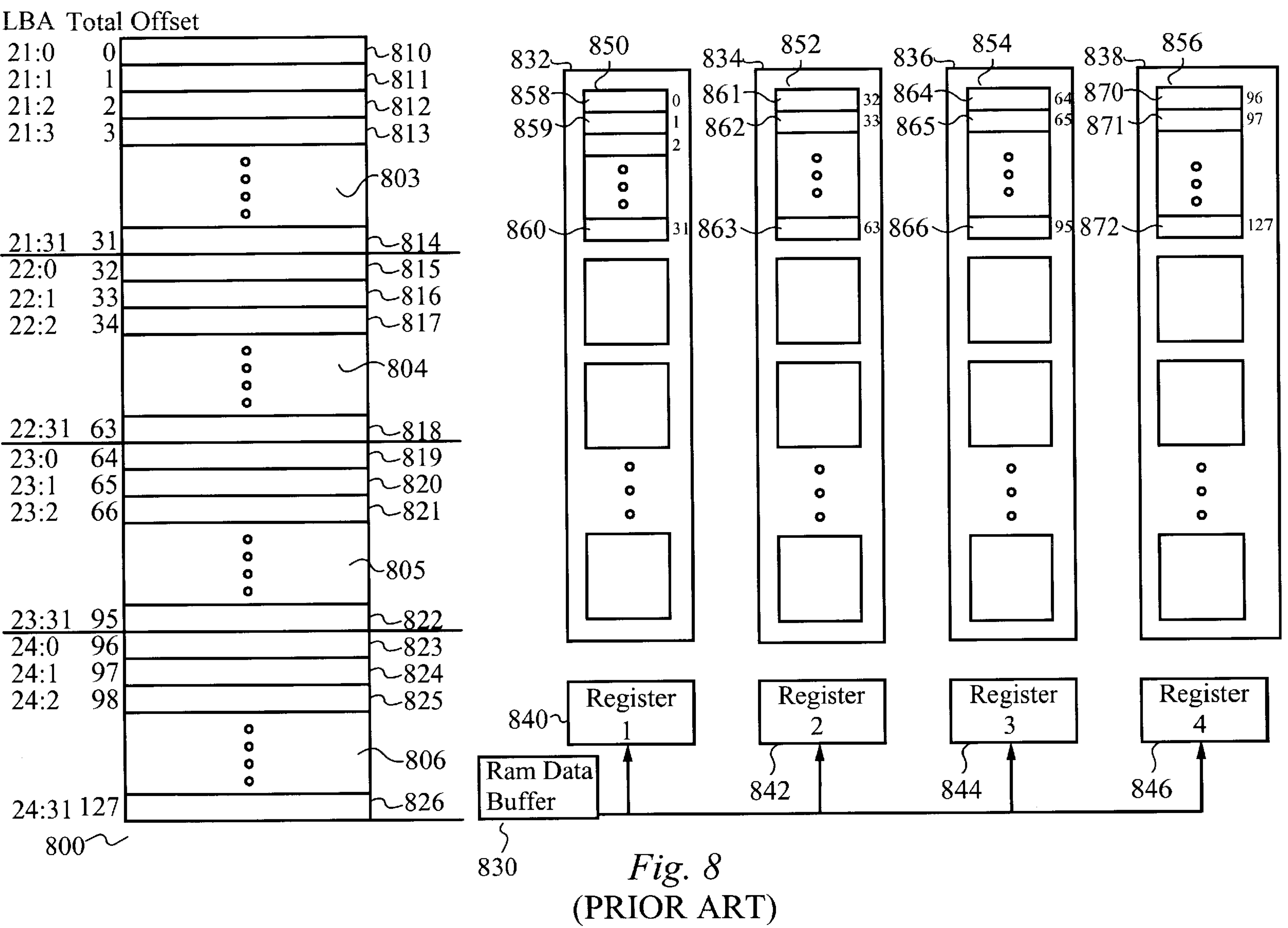
FIG. 8 is a pictorial diagram illustrating the storage of data through an interleaving process in a multibank flash memory system.

An object of the present invention involves the simultaneous programming a multibank flash memory card such that a unitary Virtual Logical Block of data is stored within a unitary Physical Data Block, wherein consecutive Logical Block Addresses of data are stored in consecutive Physical Block Addresses, thereby preserving the sequential one-to-one relationship necessary to retrieve data according to the prior art. This high-performance programming method can be illustrated using FIG. 8, which was also used to illustrate the process of data storage according to the prior art. According to the present invention, the four incoming Logical Blocks of data, 803, 804, 805, 806, would not be fragmented during the storage or programming process. Logical blocks of data which were consecutively addressed within the same Virtual Logical Block before storage would retain consecutive physical addresses when stored in the Physical Memory. For example, consecutively addressed Logical Blocks 810, 811 . . . , 814 comprising VLBA 21 803 would respectively be stored in consecutively addressed Physical Block Addresses, 858, 859, . . . , 860 within the same Physical Data Block 850. To achieve a non-fragmented storage within the Physical Memory, Data cannot be interleaved when it is sent from the RAM Data buffer 830 to the plurality of RAM Data Registers 840, . . . 846. The process by which a non fragmented storage can take place within a multibank Flash Memory System involves storing one Logical Block from each VLB per programming cycle. The plurality of Logical Block Addresses being programmed on any given cycle are identical. On successive programming steps, the process moves through consecutively addressed Logical Blocks. Logical Block Addresses defined by a common VLBA are always sent to the same RAM Data register and stored in a common Physical Data Block such that data from consecutive Logical Block Addresses are stored in consecutive physical block addresses, as illustrated herein:

During the first cycle, Data from the first Logical Block 810 of the first VLB 803 is loaded into the first RAM Data Register 840. Data from the first Logical Block 815 of the second VLB 804 is loaded into the second RAM Data Register 842. Data from the first Logical Block 819 of the third VLB 805 is loaded into the third RAM Data Register 844, and Data from the first Logical Block 810 of the fourth VLB 806 is loaded into the fourth RAM Data Register 846. The four RAM Data Registers 840, . . . , 846 then simultaneously program their contents into Physical Pages 858, 861, 864 and 870 respectively.

During the second cycle, data from the second logical block 811, 816, 820, 824 of the four respective Virtual Logical Blocks 803, 804, 805, 806 would be loaded into the four respective RAM Data Registers 840, . . . , 846, and then simultaneously program their contents into Physical Pages 858, 861, 864 and 870 respectively.

The process would continue until the final Logical Blocks 814, 818, 822, 826 from the four VLB's 803, 804, 805, 806 are respectively programmed into the final Pages 860, 863, 866, 872 of the four respective Physical Data Blocks 850, 852, 854, 856 distributed among the four exemplary Memory Banks 832, 834, 836, 838. Through this process, the original orientation of consecutive Logical Blocks within each VLB is retained in consecutive Pages of the Physical Data Blocks.

Figure 9:
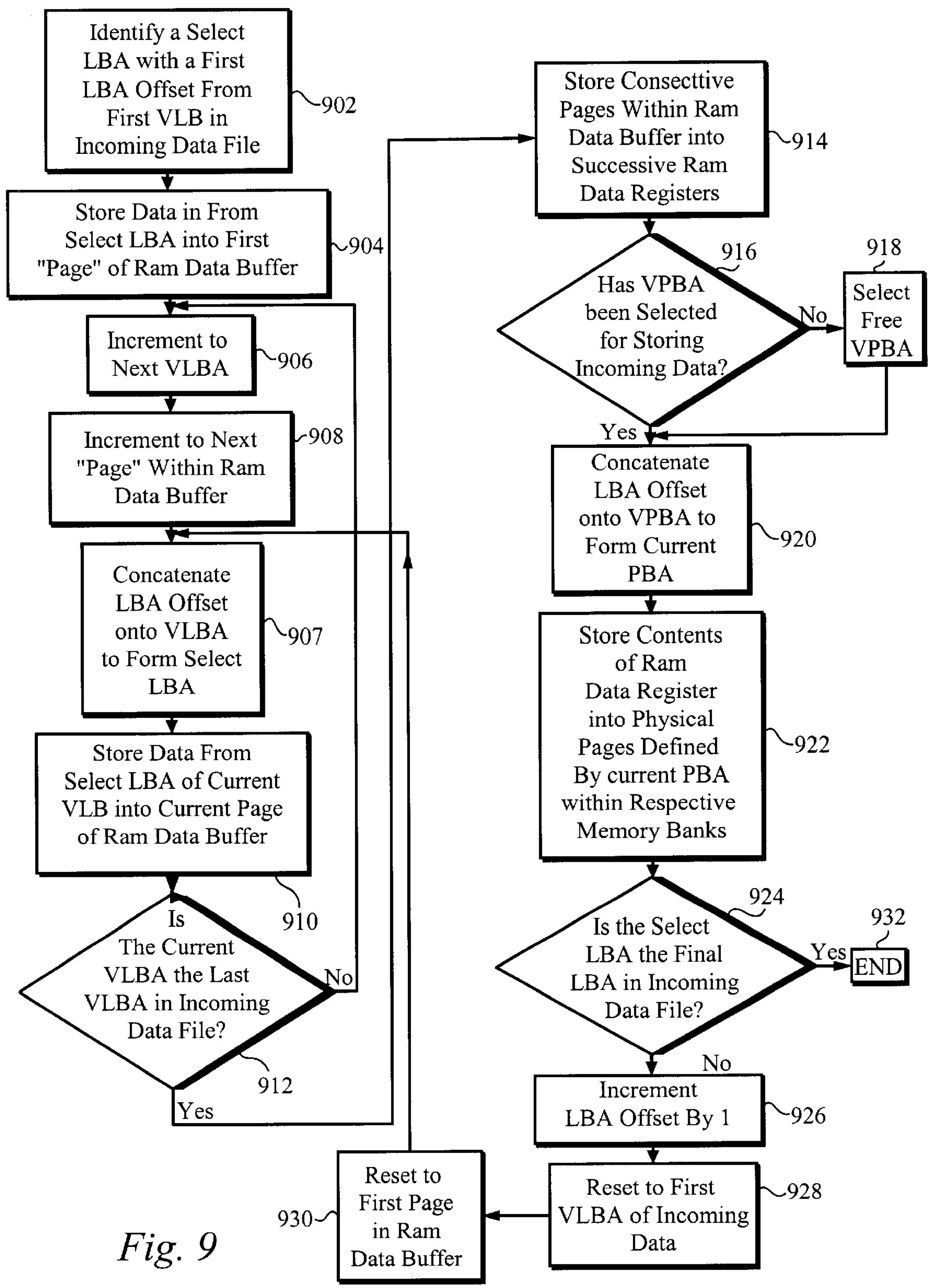
FIG. 9 is a flow chart disclosing one way of implementing the high-performance multiple memory bank storage algorithm according to the present invention.

FIG. 9 is a flow chart describing one way in which this the data arrangement could be achieved. It is understood that this flow chart describes one sequence of events for achieving this goal. Those skilled in the art will be able to generate algorithms which are functionally identical, though the specific steps may be different than those described herein. The flow chart in FIG. 9 therefore is not intended as a limitation of a method of data storage envisioned by the present invention. When a Host has identified incoming data for storage, it begins in the first Virtual Logical Block of the file of data. In the first step 902, the processor identifies the lowest Logical Block Address containing incoming data. It becomes the select Logical Block Address. In the next step 904, the controller of the Flash Memory System stores a Data from the current Logical Block within the current Virtual Logical Block into the first "page" of the RAM Data buffer. In the next step 906, the Virtual Logical Block Addresses is incremented by one. (Although the algorithm as described herein assumes that Virtual Logical Block Addresses comprising the file of incoming data are consecutive Virtual Logical Block Addresses for ease of illustration, one skilled in the art would know how to implement the present algorithm to store an incoming file of User Data comprising non sequential Virtual Logical Block Addresses.) In the next step 908, the "page" within the RAM Data buffer is incremented by one. In the following step 907, the processor concatenates the LBA offset onto the VLBA to form a select LBA. In the next step 910, data defined according to the current LBA and the current VLBA is stored in the current page of the RAM Data buffer. In the next step, 912, the processor determines if the current VLBA is the last VLBA within the incoming file of data. If it is not the last VLBA, the processor returns to step 906 and repeats the cycle from that point. If the current VLBA is the last VLBA in the incoming data file, the processor then system step 914, where consecutive Pages within the RAM Data buffer are stored into successive RAM Data Registers. According to the next step 916, the controller determines if it has already selected Virtual Physical Block Address in which to store the current data file. If no VPBA has been selected, the processor selects a free VPBA in step 918. When a processor has selected a free VPBA, according to step 920, a processor concatenates to the current VLB offset onto the current VPBA, forming a current PBA. According to next step 922, the RAM Data Registers program their contents into Pages within the respective Memory Banks defined by the current Physical Block Address. In step 924, the processor determines if the current LBA is the final LBA in the incoming file of data. If the final Logical Block of data has been stored the process terminates according to step 932. If the data stored is not the final LBA in the incoming file of data, a processor increments the LBA in step 926, resets the VLBA to the first VLBA in the incoming file data in step 928, and resets to the first "page" within the RAM Data buffer step 930. The processor returns to step 907 and continues the data storage process.

Figure 3:
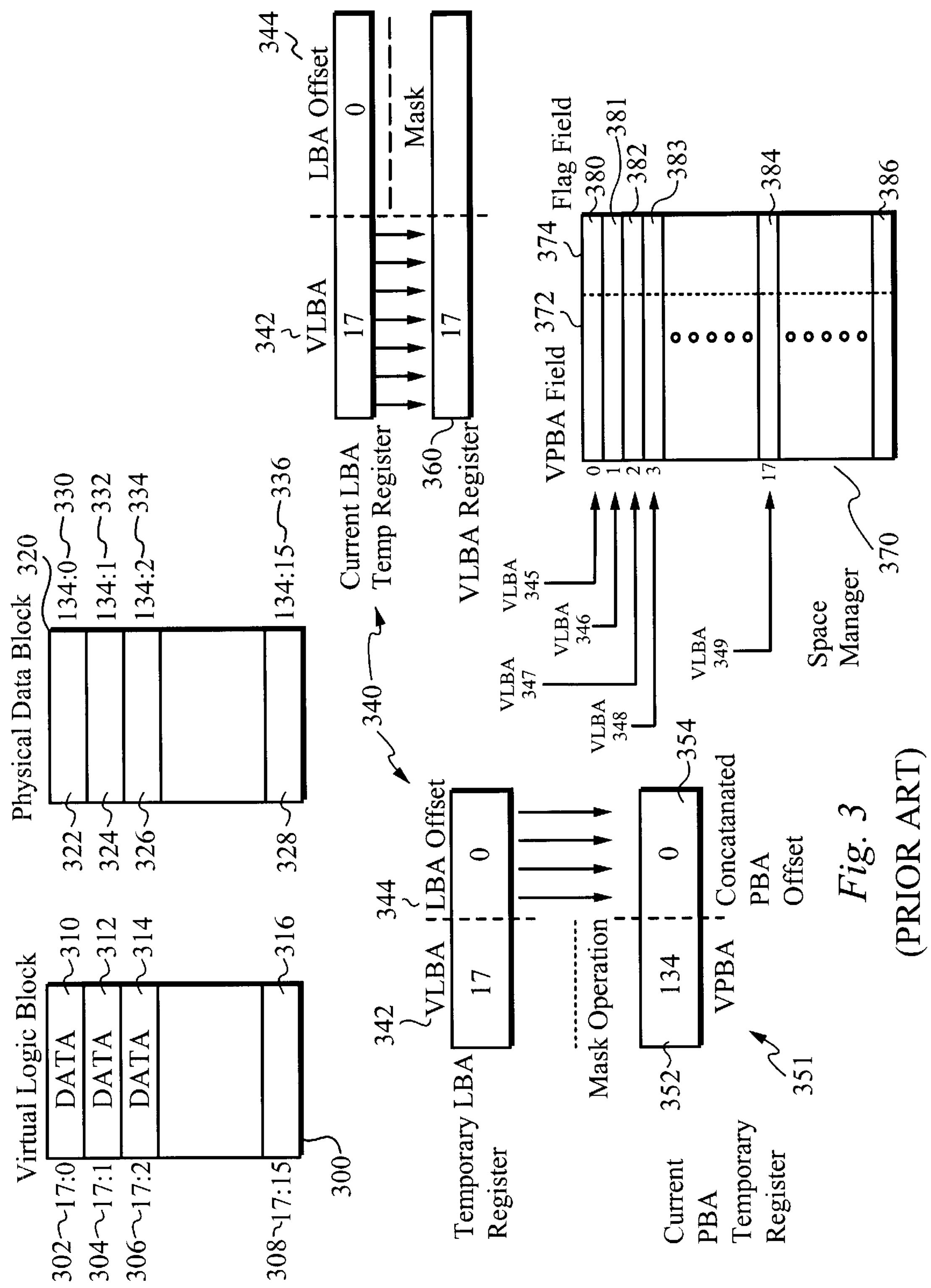
FIG. 3 discloses various registers and fields used for data correlation and storage.
Figure 4:
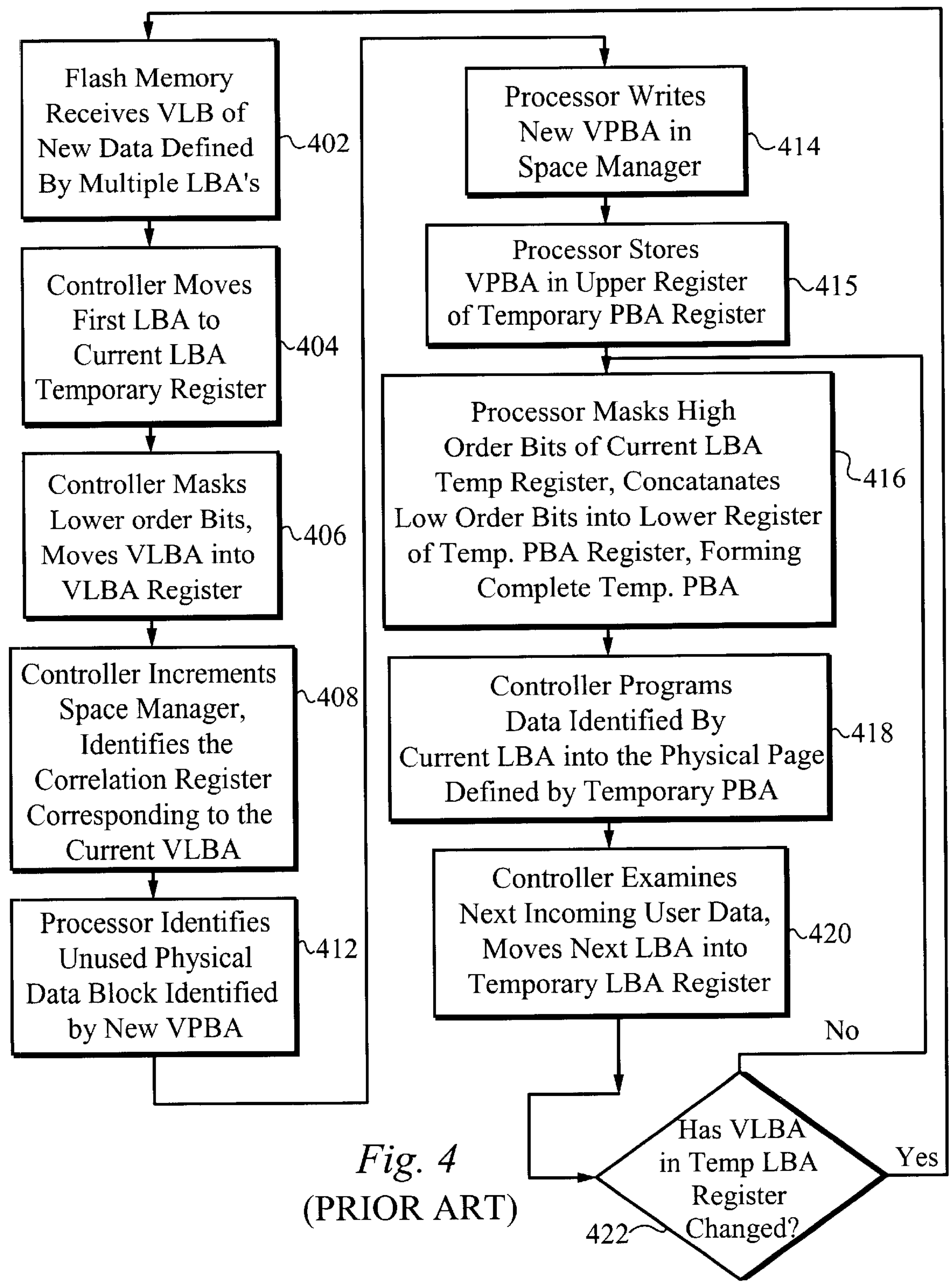
FIG. 4 is a flow chart disclosing a method of correlating physical and logical addresses during storage of data.
Figure 5:
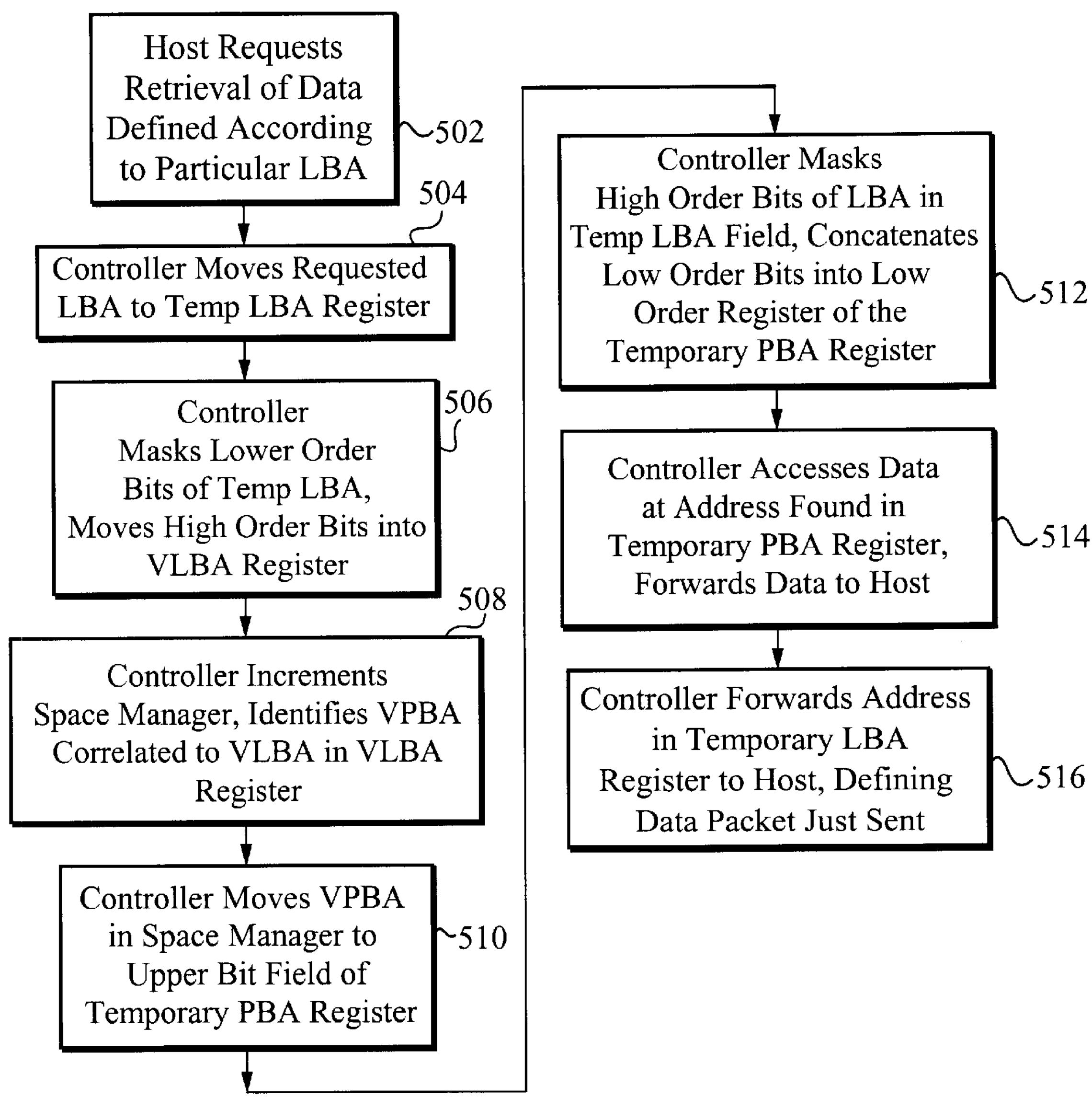
FIG. 5 is a flow chart disclosing a method of retrieving data.
Figure 6:
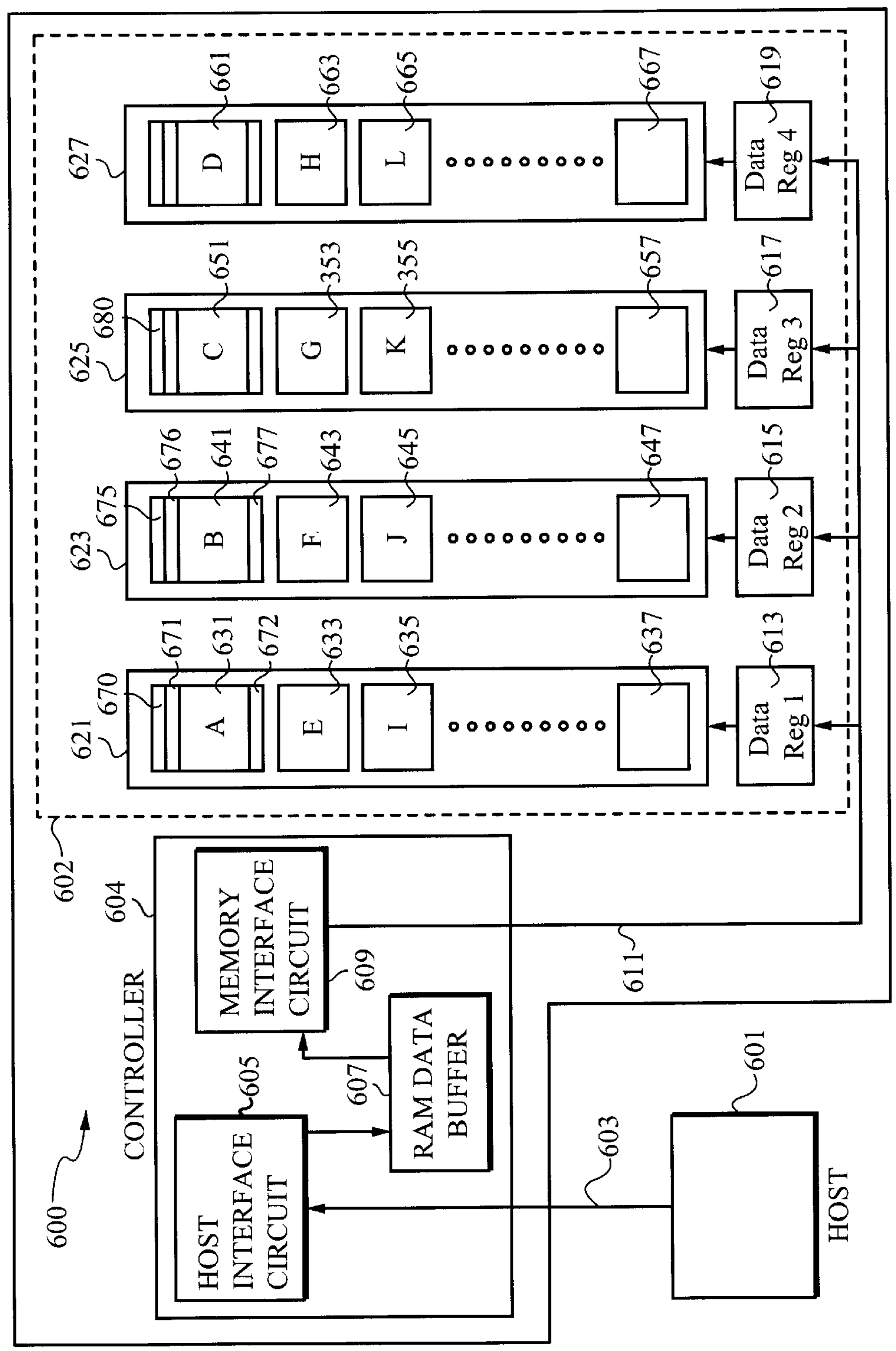
FIG. 6 is a pictorial diagram of a Flash Memory System comprising multiple memory banks, each bank comprising a single RAM Data Register.
Figure 7:
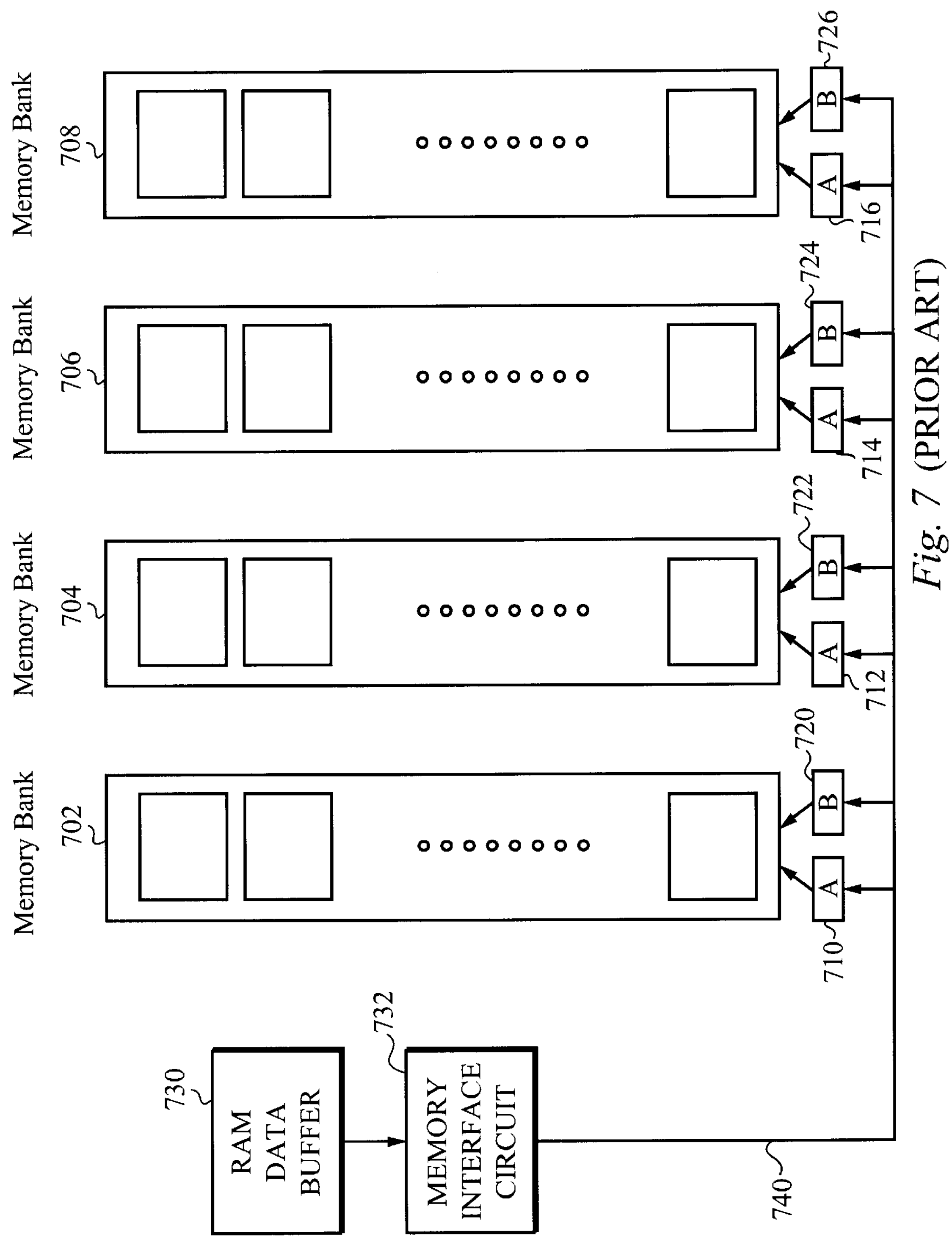
FIG. 7 is a pictorial diagram of a Flash Memory System comprising multiple memory banks, each bank comprising two RAM Data Registers.

Because the high performance data storage algorithm described herein draws data from multiple Virtual Logical Blocks throughout the entire file of incoming User Data on each cycle of data storage, if the process as disclosed above were take place exclusively within the Flash Memory System 600 FIG. 6, the RAM Data buffer 607, 830 would have to be large enough to hold the entire file of incoming User Data 800. According to the preferred embodiment therefore, the Logical Blocks of data are selected by the Host 601 on each programming cycle and sent to the RAM Data buffer 607. This advantageously allows the RAM Data Buffer 607 to be substantially reduced in size, freeing up valuable memory space within the Flash Memory System 600. In the preferred embodiment, the RAM Data Buffer 912 has memory capacity equal to the total memory of the RAM Data Registers 930, . . . 936 present within the Flash Memory System. The amount of random access memory within a Flash Memory System can be further reduced by eliminating the Space Manager 370, FIG. 3 from the Flash Memory System 600, and storing correlation data 1006 within the Host 601, as depicted in FIG. 10.

Figure 10:
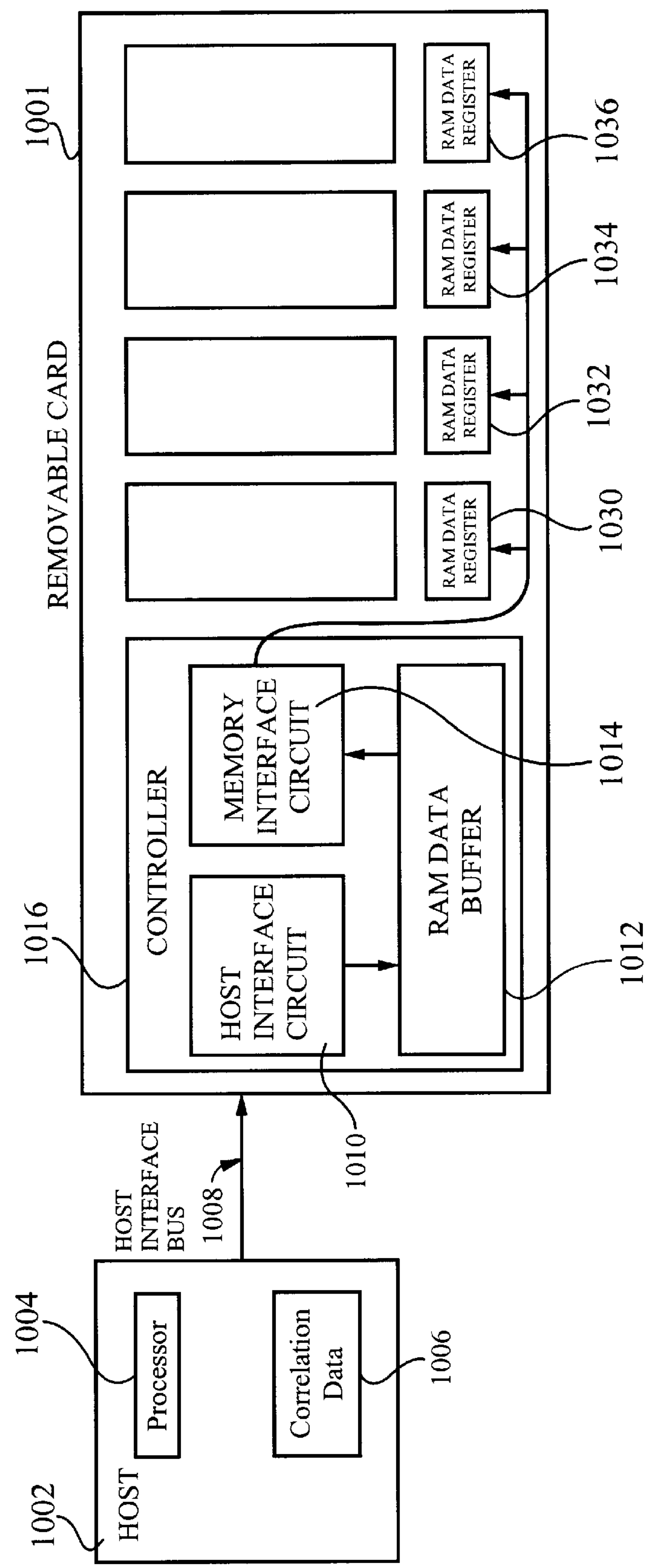
FIG. 10 shows a Host containing correlation data coupled to a Flash Memory System.

FIG. 10 depicts a host 1002 coupled to a flash memory system. The host comprises of correlation data 1006 and a processor 1004. The host transmits data to a removable flash memory card 1001. Data from the host enters the host interface circuit 1010 of the flash memory controller 1016, by means of a host interface bus 1008. The host interface circuit 1010 then controls the storage of incoming data by means of a RAM data buffer 1012. The RAM data buffer transmits the data to the memory interface circuit 1014, which in turn transmits the data to multiple RAM data registers 1030, 1032, 1034, and 1036.

A potential drawback of the high-performance non interleaved data storage process according to the present invention rests in compatibility with traditional "single-bank" Flash Memory Systems or traditional Hosts. The present invention selects a Logical Block of data from multiple VLB's on every programming cycle. Traditional Flash Memory Systems stored one Logical Block per cycle, and selected Logical Blocks consecutively. Storage of data from a second VLB was not commenced until all the data from the first VLB had been stored.

Therefore, although the arrangement of data stored within the Physical Memory is similar or identical when using a traditional Host or a high-performance Host, the process by which data is stored in both circumstances is radically different. In the traditional embodiment, sequentially received Logical Blocks of data are programmed into consecutive Physical Block Addresses within the same Physical Data Block. In the high performance embodiment, sequentially received Logical Blocks of data are simultaneously programmed into separate Physical Data Blocks distributed among separate Memory Banks. If a Flash Memory System were to store incoming data from a traditional Host according to the high performance method disclosed herein, Data coming from a traditional Host would be fragmented similar to the interleaving process, destroying the very object of the Invention. Because the Flash Memory System must adopt a different data storage algorithm for traditional and high-performance Hosts, the Flash Memory System must have a way of determining whether the Host with which it is communicating is traditional or high performance. After making this determination, the Flash Memory System must be able to configure itself to store data according to a method which is appropriate for that Host.

Figure 11:
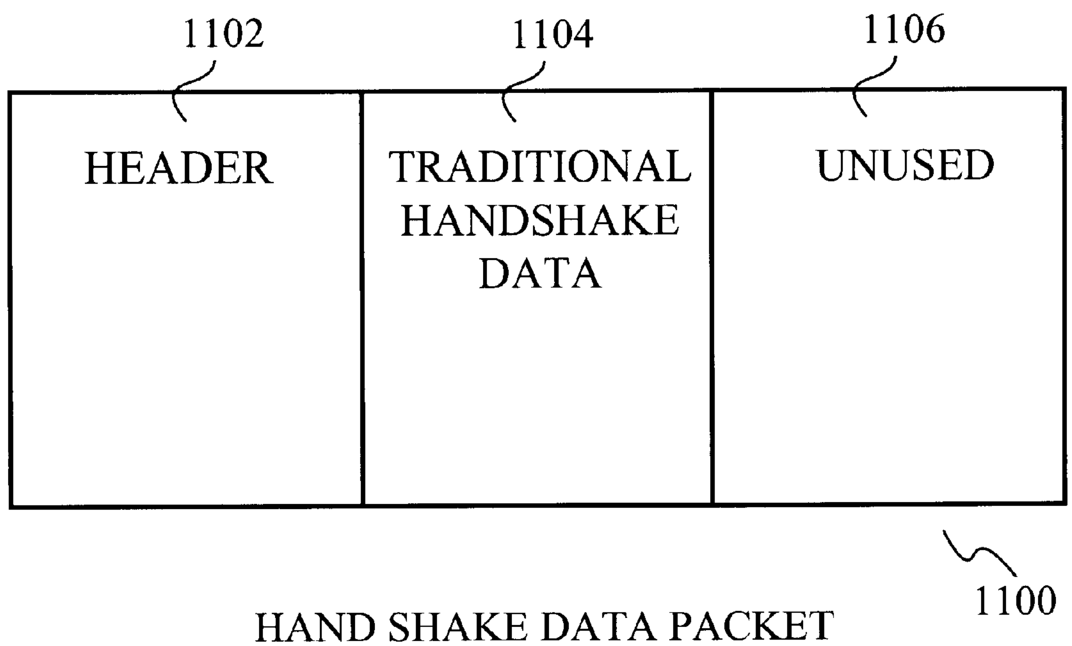
FIG. 11 shows a Handshake Data Envelope.

According to the present invention, a hand-shaking and configuration process takes place on power up. During the hand-shake process, information is exchanged between the Flash Memory System and the Host. FIG. 11 depicts a Handshake Data Packet 1100 of data transferred from the Flash Memory System to the Host on start up. The Handshake Data Packet 1100 is typically 512 bytes, including a header 1102, traditional data 1104 typically transferred on start up, and a large Unused Portion 1106 of the Handshake Data Packet 1100. When a traditional Host receives the Data Envelope 1100 on start up, it does not process, nor does it care what is stored within the Unused portion 1106 of the Handshake Data Packet 1100. According to the present invention, therefore, a multi-bank memory system will insert a Vendor Unique Value into the Unused Portion 1106 of the Handshake Data Packet 1100, which is sent to the Host on start up. There are three possible scenarios on start up.

In the first scenario, a traditional "memory stick" or Flash Memory System sends a Handshake Data Packet to a high performance Host on start up. The traditional memory stick does not have a vendor unique value, nor a means for writing such value in the Unused Portion 1106 of the Hand Shake envelope. Upon receiving the Handshake Data Packet; the high performance Host examines the Unused Portion 1106 of the Handshake Data Packet 1100 and determines that the memory stick is a traditional memory stick. The Host then defaults to the traditional configuration of sending data from consecutive Logical Block Addresses of data.

In the second possible scenario, a high performance memory stick writes a vendor unique value in the unused portion of the Handshake Data Packet on start up, and sends the Handshake Data Packet to a traditional Host. Because the Host is not a high performance Host, it cannot read or process the Vendor Unique Value, and does not respond by identifying itself as a high performance Host. The default state of the high performance memory stick is the standard mode, wherein consecutive Logical Block Addresses are stored in consecutive Physical Block Addresses. Because the Host fails to acknowledge the Vendor Unique Value on a return hand-shake, the high performance memory stick operates in the default mode, and does not perform simultaneous programming in separate memory banks.

In the third scenario, a high performance memory stick inserts a Vendor Unique Value into the unused portion of the Handshake Data Packet at start up, and sends the Handshake Data Packet to a high performance Host. Upon receipt of a Handshake Data Packet containing the specific Vendor Unique Value in the unused area of the Handshake Data Packet, the high performance Host sends a responsive handshake to the high performance memory stick, confirming the presence of a high performance Host. The Host also configures itself to send data from multiple VLB's on every cycle of programming. Upon receiving the proper response from a high performance Host, the high performance memory stick then configures itself to store incoming data in successive memory banks, as disclosed according to the present invention.

In an alternative embodiment, the RAM Data buffer 607 within the high performance Flash Memory System is large enough to store entire file of incoming User Data. A disadvantage of this embodiment is the significant amount of memory consumed by the RAM Data buffer 607. An advantage of this embodiment is that it would be able to download an entire file of user data from a traditional Host, and perform multibank simultaneous storage, thereby allowing a traditional Host to utilize the speed advantages of a multibank Flash Memory System.

The present invention has been described in terms of specific embodiments incorporating many specific details offered to facilitate an understanding of the principles of construction and operation of the invention. The reference herein to specific embodiments and details thereof are not intended to limit the scope of the claims appended hereto. It will be apparent to those skilled in the art that modifications may be made to the embodiments chosen for illustration without departing from the spirit and scope of the invention.

What is claimed:

1. A flash memory system comprising a plurality of separate and independently addressable memory banks, each memory bank comprising:

a. a plurality of independently addressable and independently programmable non-volatile data storage areas;

b. a primary RAM data register; and c. a vendor unique value, including means for loading the vendor unique value into a handshake data packet upon start up, wherein the flash memory system is configured to selectively operate in a first mode of data storage and in a second mode of data storage in response to the vendor unique value, the first mode of data storage being a default mode, wherein a single programming cycle according to the first mode of data storage comprises a storage of data into a single RAM data register for programming into a single page.

2. The flash memory system according to claim 1 further comprising a controller with a host interface circuit, a RAM data buffer and a memory interface circuit, the RAM data buffer being operatively coupled to the host interface circuit and to the memory interface circuit, the memory interface circuit being operatively coupled to the primary RAM data register in each of the plurality of memory banks by means of a data bus, wherein the controller is capable of controlling a programming of data into the plurality of data storage areas distributed among the plurality of memory banks through the primary RAM data register associated with the respective plurality of memory banks.

3. The flash memory system according to claim 2 wherein the data storage areas within the plurality of memory banks include a plurality of physical data blocks, each physical data block being comprised of a plurality of pages.

4. The flash memory system according to claim 3 wherein the single programming cycle according to the second mode of data storage comprises the storage of data from the RAM data buffer into a plurality of RAM data registers, wherein the plurality of RAM data registers simultaneously program data into a respective plurality of pages.

5. The flash memory system according to claim 4 further comprising:

a. a host; and b. means for transmitting the handshake data packet to the host upon start up.

6. The flash memory system according to claim 5 wherein the controller is configured to store incoming user data according to the first mode of data storage when no responsive handshake is received from the host.

7. The flash memory system according to claim 6, wherein the controller is configured to store incoming user data according to the second mode of data storage when a responsive handshake is received from the host.

8. The flash memory system according to claim 7 wherein a RAM data register comprises sufficient memory to program a physical page.

9. The flash memory system according to claim 7 further comprising means for selecting a plurality of logical blocks of incoming data to be programmed into separate pages within the flash memory system during a cycle of operation.

10. The flash memory system according to claim 9 wherein means for selecting the plurality of logical blocks is resident within the host.

11. The flash memory system according to claim 10 wherein the host is a digital camera.

12. The flash memory system according to claim 9 wherein means for selecting the plurality of logical blocks is resident within the flash memory system.

13. The flash memory system according to claim 12 wherein the RAM data buffer comprises sufficient memory to store an entire file of incoming user data.

14. The flash memory system according to claim 9, wherein each memory bank further comprising an auxiliary RAM data register, wherein a first auxiliary RAM data buffer within a first memory bank is capable of programming data into data storage areas within the first memory bank, and a second auxiliary RAM data register is capable of programming data into data storage areas within a second memory bank.

15. A method of programming incoming data into a multibank flash memory system comprising a vendor unique value, a controller operatively coupled to a memory system, the controller comprising a RAM data buffer operatively coupled to a memory interface circuit, the flash memory system comprising a plurality of separate and individually addressable memory banks, each memory bank comprising a primary RAM data register and a plurality of individually addressable and individually programmable physical data blocks, each physical data block comprising a plurality of individually addressable and individually programmable pages, the method comprising the steps of:

a. generating a handshake data packet;

b. loading the vendor unique value within the flash memory system into the handshake data packet;

c. sending the handshake data packet from the flash memory system to a host;

d. defaulting to a first data storage configuration; and e. programming incoming data into the flash memory system according to a first data storage method, wherein the first data storage method comprises the step of programming one page of user data per programming cycle, wherein the flash memory system is configured to selectively operate in a first mode of data storage and in a second mode of data storage in response to the vendor unique value, the first mode of data storage being a default mode.

16. The method according to claim 15 further comprising the steps of:

a. sending a reply handshake from the host to the flash memory system;

b. configuring the flash memory system according to a second data storage configuration; and c. programming incoming data into the flash memory system according to the second data storage method, wherein the second data storage method comprises the step of simultaneously programming a plurality of pages of data into multiple memory banks on each programming cycle.

17. The method according to claim 16 wherein the step of programming incoming data into the flash memory system according to the second data storage method further comprises the steps of:

a. loading a first initial logical block of data defined by a first VLBA a first primary RAM data register within a first memory bank;

b. loading a second initial logical block of data defined by a second VLBA into a second primary RAM data register within a second memory bank; and c. simultaneously programming:

i. the first initial logical block of data within the first primary RAM data register into a first initial page of a first physical data block within the first memory bank, and ii. the second initial logical block of data within the second primary RAM data register into a second initial page of a second physical data block within the second memory bank.

18. The method according to claim 17 further comprising the steps of:

a. loading a first subsequent logical block of data defined by the first VLBA into the first primary RAM data register within the first memory bank;

b. loading a second subsequent logical block of data defined by a second VLBA into the second primary RAM data register within the second memory bank; and c. simultaneously programming:

i. the first subsequent logical block of data within the first primary RAM data register into a first subsequent page of the first physical data block; and ii. the second subsequent logical block of data within the second primary RAM data register into a second subsequent page of the second physical data block.

19. The method according to claim 18 wherein:

a. the first initial logical block and the first subsequent logical block are defined by consecutive logical block addresses within the first virtual logical block;

b. the second initial logical block and the second subsequent logical block are defined by consecutive logical block addresses within the second virtual logical block;

c. the step of loading the first subsequent logical block sequentially follows the step of loading the first initial logical block data into the first primary RAM data register;

d. the step of loading the second subsequent logical block sequentially follows the step of loading the second initial logical block of data into the second primary RAM data register;

e. the first initial page and the first subsequent page are defined by consecutive physical block addresses within the first physical data block; and f. the second initial page of the second subsequent page are defined by consecutive physical block addresses within the second physical data block.

20. The method according to claim 19 wherein each of the plurality of physical data blocks within the plurality of memory banks of the flash memory system comprises an identical number of pages which are addressed according to an identical page addressing scheme.

21. The method according to claim 20 wherein the first initial page within the first physical data block and the second initial page within the second physical data block are defined according to a same page address.

22. The method according to claim 21 wherein each memory bank comprises an identical number of physical data blocks which are addressed according to an identical block addressing scheme.

23. The method according to claim 22 wherein the first physical data block and the second physical data block are defined according to a same physical block address.

24. The method according to claim 23 wherein an address of the first memory bank and an address of the second memory bank are consecutive addresses.

25. The method according to claim 24 wherein each of the plurality of separate and separately addressable memory banks individually comprise a second auxiliary RAM data register, the method further comprising the steps of:

a. loading the first subsequent logical block of data within the first virtual logical block into a first auxiliary RAM data register within the first memory bank;

b. loading the second subsequent logical block of data within the second virtual logical block into the second auxiliary RAM data register within the second memory bank; and c. simultaneously programming:

i. the first subsequent logical block of data within the first auxiliary RAM data register into a first subsequent page within the first physical data block; and ii. the second subsequent logical block of data within the second auxiliary RAM data register into a second subsequent page within the second physical data block.

26. The method according to claim 25 wherein a. the first initial logical block and the first subsequent logical block are consecutively addressed within the first virtual logical block addresses;

b. the second initial logical block and the second subsequent logical block are consecutively addressed within the second virtual logical block addresses;

c. the step of loading a first initial logical block and the step of loading a first subsequent logical block comprise sequential steps of loading data into a plurality of RAM data registers of the first memory bank;

d. the step of loading the second initial logical block and the step of loading the second subsequent logical block comprise sequential steps of loading data into a plurality of RAM data registers of the second memory bank;

e. the first initial page and the first subsequent page are consecutively addressed within the first physical data block; and f. the second initial page and the second subsequent page are consecutively addressed within the second physical data block.

27. The method according to claim 20 wherein the step of programming incoming data into the flash memory system according to the first data storage method comprises sequential steps of:

a. programming data defined by a first logical block address into a first page of a physical data block; and b. programming data defined by a second logical block address into a second page of the physical data block, wherein the first logical block address and the second logical block address are defined by consecutive addresses within a same virtual logical block address, and wherein the first page and the second page are defined by consecutive physical block addresses within the same physical data block.

28. A method of programming a flash memory system with incoming data from a host, comprising the steps of:

a. operatively coupling the flash memory system to a host; and b. examining a handshake data packet sent by the flash memory system, wherein the flash memory system is configured to selectively operate in a first mode of data storage and in a second mode of data storage in response to the vendor unique value, the first mode of data storage being a default, wherein the method further comprises the steps of configuring the host to a standard mode of operation and storing data within the flash memory system according to the standard mode of operation when the handshake data packet lacks a vendor unique value.

29. The method according to claim 28, wherein the method further comprises the steps of configuring the host to a high-performance mode of operation and storing data within the flash memory system according to the high-performance mode of operation when the handshake data packet comprises the vendor unique value.

30. The method according to claim 29 wherein the step of storing data within the flash memory system according to the high-performance mode of operation comprises the steps of:

a. loading a first initial logical block of data defined by a first VLBA into a first primary RAM data register within a first memory bank;

b. loading a second initial logical block of data defined by a second VLBA into a second primary RAM data register within a second memory bank; and c. simultaneously programming:

i. the first initial logical block of data within the first primary RAM data register into a first initial page of a first physical data block within the first memory bank, and ii. the second initial logical block of data within the second primary RAM data register into a second initial page of a second physical data block within the second memory bank.

31. The method according to claim 30 further comprising the steps of:

a. loading a first subsequent logical block of data defined by the first VLBA into the first primary RAM data register within the first memory bank;

b. loading a second subsequent logical block of data defined by a second VLBA into the second primary RAM data register within the second memory bank; and c. simultaneously programming:

i. the first subsequent logical block of data within the first primary RAM data register into a first subsequent page of the first physical data block; and ii. the second subsequent logical block of data within the second primary RAM data register into a second subsequent page of the second physical data block.

32. The method according to claim 31 wherein a. the first initial logical block and the first subsequent logical block are defined by consecutive logical block addresses within the first virtual logical block;

b. the second initial logical block and the second subsequent logical block are defined by consecutive logical block addresses within the second virtual logical block;

c. the step of loading the first subsequent logical block sequentially follows the step of loading the first initial logical block data into the first primary RAM data register;

d. the step of loading the second subsequent logical block sequentially follows the step of loading the second initial logical block of data into the second primary RAM data register;

e. the first initial page and the first subsequent page are defined according to consecutive PBA's within the first physical data block; and f. the second initial page of the second subsequent page are defined according to consecutive PBA's within the second physical data block.

33. The method according to claim 32 wherein each of the plurality of physical data blocks within the plurality of memory banks of the flash memory system comprises an identical number of pages which are addressed according to an identical page addressing scheme.

34. The method according to claim 33 wherein the first initial page within the first physical data block and the second initial page within the second physical data block are defined according to a same page address.

35. The method according to claim 34 wherein each memory bank comprises an identical number of physical data blocks which are addressed according to an identical block addressing scheme.

36. The method according to claim 35 wherein the first physical data block and the second physical data block are defined according to a same physical block address.

37. The method according to claim 28 wherein the step of storing data within a flash memory system according to the standard mode of operation comprises the steps of:

a. programming the data from a first logical block address into a first page of a physical data block; and b. programming the data from a second logical block address into a second page of the physical data block, wherein the first logical block address and the second logical block address are consecutive addresses within the same virtual logical block, and wherein the first page and the second page are defined by consecutive physical block addresses.

38. A flash memory system comprising:

a. a plurality of separate and independently addressable memory banks;

b. a primary RAM data register;

c. a vendor unique value, including means for loading the vendor unique value into a handshake data packet upon start up and means for examining the handshake data packet sent by the flash memory system;

d. means for simultaneously storing a plurality of data storage areas in an interleaved manner in the plurality of memory banks from the primary RAM data register in response to a predetermined vendor unique value, such that programming time is reduced; and e. means for storing data sequentially in the memory banks in a non-interleaved manner in an absence of the predetermined vendor unique value.

39. A flash memory system comprising:

a. a plurality of separate and independently addressable memory banks;

b. a primary RAM data register;

c. a vendor unique value, including means for loading the vendor unique value into a handshake data packet upon start up and means for examining the handshake data packet sent by the flash memory system; and d. means for storing data sequentially in the memory banks in a non-interleaved manner in an absence of a predetermined vendor unique value, wherein the flash memory system is configured to simultaneously program a plurality of pages of data into the plurality of memory banks for a host that is capable of high performance flash memory operation.

* * * * *

UNITED STATES PATENT AND TRADEMARK OFFICE

CERTIFICATE OF CORRECTION

PATENT NO. : 6,721,843 B1
APPLICATION NO. : 09/611676
DATED : April 13, 2004
INVENTOR(S) : Petro Estakhri It is certified that error appears in the above-identified patent and that said Letters Patent is hereby corrected as shown below:

Column 6,
Line 58, “651,…, 657” should be -- 651, 353, 355, 657 --.

Column 7,
Line 51, “with the” should be -- is --.

Column 9,
Line 57, “in in” should be -- in --.

Column 10,
Line 5, “Across” should be -- across --;
Line 31, delete “and”.

Column 16,
Line 27, “system” should be -- proceeds to --.

Signed and Sealed this

Twenty-seventh Day of June, 2006

JON W. DUDAS
*Director of the United States Patent and Trademark Office*